(12) United States Patent
Kanakarajan et al.

(10) Patent No.: US 7,285,321 B2
(45) Date of Patent: Oct. 23, 2007

(54) MULTILAYER SUBSTRATES HAVING AT LEAST TWO DISSIMILAR POLYIMIDE LAYERS, USEFUL FOR ELECTRONICS-TYPE APPLICATIONS, AND COMPOSITIONS RELATING THERETO

(75) Inventors: Kuppsuamy Kanakarajan, Dublin, OH (US); Brian C. Auman, Pickerington, OH (US); Sounak Banerji, Cary, NC (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 249 days.

(21) Appl. No.: 10/706,000

(22) Filed: Nov. 12, 2003

(65) Prior Publication Data

US 2005/0100719 A1 May 12, 2005

(51) Int. Cl.
*B32B 3/00* (2006.01)
*H05K 1/00* (2006.01)

(52) U.S. Cl. .................. 428/209; 428/473.5; 174/258; 174/259

(58) Field of Classification Search ................ 428/209, 428/901, 473.5; 174/258, 259
See application file for complete search history.

(56) References Cited

U.S. PATENT DOCUMENTS

| 4,075,420 | A | * | 2/1978 | Walton ..................... 174/251 |
| 4,543,295 | A | * | 9/1985 | St. Clair et al. ............. 428/458 |
| 4,629,127 | A | | 12/1986 | Kawamura et al. |
| 4,923,698 | A | | 5/1990 | Rodero |
| 5,103,293 | A | * | 4/1992 | Bonafino et al. ............ 257/702 |
| 5,166,292 | A | * | 11/1992 | Pottiger et al. ............... 526/59 |
| 5,219,977 | A | | 6/1993 | Kreuz |
| 5,234,522 | A | * | 8/1993 | Suzuki et al. ................ 156/249 |
| 5,276,132 | A | | 1/1994 | Nishikawa et al. |

(Continued)

FOREIGN PATENT DOCUMENTS

EP 0 659 553 A1 6/1995

(Continued)

*Primary Examiner*—Cathy F. Lam

(57) ABSTRACT

The present invention relates to a multi-layer laminate having a low glass transition temperature polyimide layer, a high glass transition temperature polyimide layer, and a conductive layer.

The low glass transition temperature polyimide layer is synthesized by contacting an aromatic dianhydride with a diamine component, the diamine component comprising about 50 to about 90 mole % aliphatic diamine (the remainder being aromatic diamine) having the structural formula $H_2N$—R—$NH_2$ wherein R is hydrocarbon from $C_4$ to $C_{16}$. The low glass transition polyimide is an adhesive and has a glass transition temperature in the range of from 150° C. to 200° C.

The high glass transition temperature polyimide layer has a glass transition temperature above the low glass transition temperature polyimide layer and is a thermoset polyimide.

A multi-layer-layer substrate of the present invention has the high glass transition temperature polyimide layer positioned between the conductive layer and the low glass transition polyimide, or optionally contains an additional low glass transition temperature polyimide positioned between the conductive layer and the high glass transition polyimide layer.

16 Claims, 2 Drawing Sheets

U.S. PATENT DOCUMENTS

| | | |
|---|---|---|
| 5,298,331 A | 3/1994 | Kanakarajan et al. |
| 5,298,590 A | 3/1994 | Isogai et al. |
| 5,350,539 A | 9/1994 | Mishina et al. |
| 5,375,029 A | 12/1994 | Fukunaga et al. |
| 5,411,765 A | 5/1995 | Kanakarajan et al. |
| 5,922,167 A | 7/1999 | Rosenfeld |
| 6,015,607 A | 1/2000 | Fraivillig |
| 6,159,611 A | 12/2000 | Lee et al. |
| 6,208,031 B1 | 3/2001 | Fraivillig |
| 6,268,070 B1 | 7/2001 | Bergstresser et al. |
| 6,379,784 B1 | 4/2002 | Yamamoto et al. |
| 6,548,179 B2 * | 4/2003 | Uhara et al. ............ 428/473.5 |

FOREIGN PATENT DOCUMENTS

| | | |
|---|---|---|
| EP | 1 424 352 A | 6/2004 |
| JP | 10 182822 A | 7/1998 |

* cited by examiner

MULTILAYER SUBSTRATES HAVING AT LEAST TWO DISSIMILAR POLYIMIDE LAYERS, USEFUL FOR ELECTRONICS-TYPE APPLICATIONS, AND COMPOSITIONS RELATING THERETO

BACKGROUND OF THE INVENTION

1. Field of the Invention

The present invention relates generally to multi-layer substrates suitable for electronics applications, such as, bonding films to form multi-layer flexible circuits, rigid-flex circuits, chip scale packaging, wafer scale packaging or the like. More specifically the multi-layer substrates of the present invention comprise a metal layer, an aliphatic/aromatic polyimide layer and an aromatic polyimide layer, combined in a way to provide advantageous strength and (z-axis) coefficient of thermal expansion properties.

2. Discussion of Related Art

U.S. Pat. No. 5,922,167 to Rosenfeld is directed to polyimide adhesive compositions, having bonding temperatures taught to be in a range of about 250° C. to 450° C.

The present invention relates to prior research disclosed in U.S. Pat. No. 5,298,331, to Kanakarajan, et al. for polyimide adhesives with bonding temperatures in a range of about 250° C. to 275° C. The methods of manufacture and use described in the Kanakarajan patent are also applicable to the polyimide adhesives of the present invention, and therefore the Kanakarajan et al. patent is hereby incorporated by reference into this specification for all teachings therein.

SUMMARY OF THE INVENTION

The present invention is directed to multi-layer substrates comprising: i. a conducive layer; ii. an aliphatic-aromatic polyimide layer having a low (less than 225° C.) lamination temperature (hereafter, referred to as a "low $T_g$" polyimide layer); and iii. a polyimide layer having a high (greater than 225° C.) lamination temperature (hereafter, referred to as a "high $T_g$" polyimide layer).

The difference in lamination temperature between the high $T_g$ polyimide layer and the low $T_g$ polyimide layer is generally in a range between and including any two of the following (in ° C.): 10, 15, 20, 25, 30, 35, 40, 45, 50, 75, 100, 125, 150, 175, and 200° C.

"Base polymer" as used herein is intended to mean the dominant polymer component (at least 50, 55, 60, 65, 70, 75, 80, 85, 90, 95 or 100 weight percent of all polymers present in the adhesive compositions of the present invention). Generally speaking, the (polyimide) base polymer will be at least 25, 30, 35, 40, 45, 50, 55, 60, 65, 70, 75, 80, 85, 90, 95 or 100 weight percent of the overall adhesive composition of the present invention.

The base polymer for the low $T_g$ polyimide layer of present invention is a polyimide synthesized by a polycondensation reaction, involving the reaction of one or more aromatic dianhydrides with at least two types of diamines—aromatic diamine and aliphatic diamine. Substantially all of the diamine is either aliphatic or aromatic, and the mole ratio of aliphatic diamine to aromatic diamine is A:B, where A is a range of from about 50, 55, 60, or 65 to about 70, 75, 80, 85 or 90, and B is a range of from about 10, 15, 20 or 25 to about 30, 35, 40, 45 or 50.

The base polymer for the high $T_g$ polyimide layer of present invention is generally derived from one or more aromatic dianhydrides and one or more aromatic diamines, wherein at least 70, 75, 80, 85, 90, 95, 96, 97, 98, 99 or 100% of the hydrocarbon linkages of the base polymer contribute to an aromatic moiety. "$T_g$" as used herein refers to glass transition temperature.

As used herein, an "aromatic diamine" is intended to mean a diamine having at least one aromatic ring, either alone (i.e., a substituted or unsubstituted, functionalized or unfunctionalized benzene or similar-type aromatic ring) or connected to another (aromatic or aliphatic) ring, and such an amine is to be deemed aromatic, regardless of any non-aromatic moieties that might also be a component of the diamine. Hence, an aromatic diamine backbone chain segment is intended to mean at least one aromatic moiety between two adjacent imide linkages. As used herein, an "aliphatic diamine" is intended to mean any organic diamine that does not meet the definition of an aromatic diamine.

Depending upon context, "diamine" as used herein is intended to mean: (i) the unreacted form (i.e., a diamine monomer); (ii) a partially reacted form (i.e., the portion or portions of an oligomer or other polyimide precursor derived from or otherwise attributable to diamine monomer) or (iii) a fully reacted form (the portion or portions of the polyimide derived from or otherwise attributable to diamine monomer). The diamine can be functionalized with one or more moieties, depending upon the particular embodiment selected in the practice of the present invention.

Indeed, the term "diamine" is not intended to be limiting (or interpreted literally) as to the number of amine moieties in the diamine component. For example, (ii) and (iii) above include polymeric materials that may have two, one, or zero amine moieties. Alternatively, the diamine may be functionalized with additional amine moieties (in addition to the amine moieties at the ends of the monomer that react with dianhydride to propagate a polymeric chain). Such additional amine moieties could be used to crosslink the polymer or to provide other functionality to the polymer.

Similarly, the dianhydride as used herein is intended to mean the component that reacts with (is complimentary to) the diamine and in combination is capable of reacting to form an intermediate polyamic acid (which can then be cured into a polyimide). Depending upon context, "anhydride" as used herein can mean not only an anhydride moiety per se, but also a precursor to an anhydride moiety, such as: (i) a pair of carboxylic acid groups (which can be converted to anhydride by a de-watering or similar-type reaction); or (ii) an acid halide (e.g., chloride) ester functionality (or any other functionality presently known or developed in the future which is) capable of conversion to anhydride functionality.

Depending upon context, "dianhydride" can mean: (i) the unreacted form (i.e. a dianhydride monomer, whether the anhydride functionality is in a true anhydride form or a precursor anhydride form, as discussed in the prior above paragraph); (ii) a partially reacted form (i.e., the portion or portions of an oligomer or other partially reacted or precursor polyimide composition reacted from or otherwise attributable to dianhydride monomer) or (iii) a fully reacted form (the portion or portions of the polyimide derived from or otherwise attributable to dianhydride monomer).

The dianhydride can be functionalized with one or more moieties, depending upon the particular embodiment selected in the practice of the present invention. Indeed, the term "dianhydride" is not intended to be limiting (or interpreted literally) as to the number of anhydride moieties in the dianhydride component. For example, (i), (ii) and (iii) (in the paragraph above) include organic substances that may have two, one, or zero anhydride moieties, depending upon whether the anhydride is in a precursor state or a reacted state. Alternatively, the dianhydride component may be functionalized with additional anhydride type moieties (in addition to the anhydride moieties that react with diamine to provide a polyimide). Such additional anhydride moieties could be used to crosslink the polymer or to provide other functionality to the polymer.

Ordinary skill and experimentation may be necessary in preparing the polyimide compositions of the present invention, depending upon the particular monomers selected and the particular polyimide manufacturing process selected in the practice of the present invention. In one embodiment, the low $T_g$ polyimide compositions of the present invention are polymerized to a sufficient viscosity and cured to a sufficient degree to provide the following properties:

A. z-axis dimensional stability (a z-axis coefficient of thermal expansion factor) of less than 80, 85, 90, 95, 100, 105, 110, 115, 120, 125, 130, 135, 140, 145, or 150 ppm/° C. (ASTM Method IPC-650 2.4.41), B. a glass transition temperature from about 150, 160, 170, 180, or 185 to about 190, 195, 197 or 200° C.; and C. a modulus from 1, 5, 10, 25, 50, 75, or 100 to about 125, 150, 175 or 200, 250, 300, 400, 500, 600, 700, 800, 900, 1000, 1200 or more kpsi.

It would be impossible to discuss or describe all possible polyimide manufacturing processes useful in the practice of the present invention. It should be appreciated that the monomer systems of the present invention are capable of providing the above-described advantageous properties in a variety of manufacturing processes. The compositions of the present invention can be manufactured as described herein and can be readily manufactured in any one of many (perhaps countless) ways of those of ordinarily skilled in the art, using any conventional or non-conventional polyimide (and multi-layer) manufacturing technology.

The conductive layer of the present invention can be created by:

i. metal sputtering (optionally, then electroplating);
ii. foil lamination; and/or
iii. any conventional or non-conventional method for applying a thin metallic layer to a substrate.

In one embodiment of the present invention, the high $T_g$ polyimide layer is placed between the conductive layer and the low $T_g$ polyimide layer to improve structural integrity and/or improved stability to environmental changes, such as heat and humidity. The resulting electronic circuit (defined by, connected to, or otherwise integrated with the metal layer) shows improved low (signal) loss in high-speed digital applications.

In another embodiment of the present invention, a low $T_g$ polyimide layer is placed between a conductive layer and a high $T_g$ polyimide layer, and a second low $T_g$ polyimide layer is placed on the opposite side of the high $T_g$ polyimide. One advantage of this type of construction is that the lamination temperature of the multi-layer substrate is lowered to the lamination temperature necessary for the low $T_g$ polyimide layer to bond.

BRIEF DESCRIPTION OF THE DRAWINGS

The accompany Figure(s) illustrate multi-layer substrates of the present invention.

DESCRIPTION OF THE PREFERRED EMBODIMENTS

Figure 1:
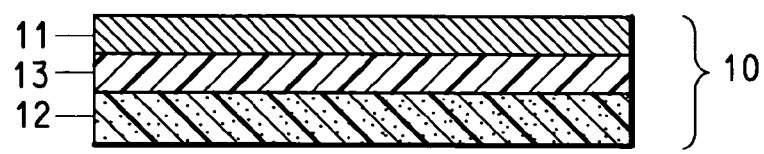
FIG. 1 illustrates a three layer substrate in accordance with the present invention, wherein the high $T_g$ polyimide layer (13) is interposed between the conductive layer (11) and the low $T_g$ layer (12), and is also in an adjacent and contacting relationship to those layers.
Figure 2:
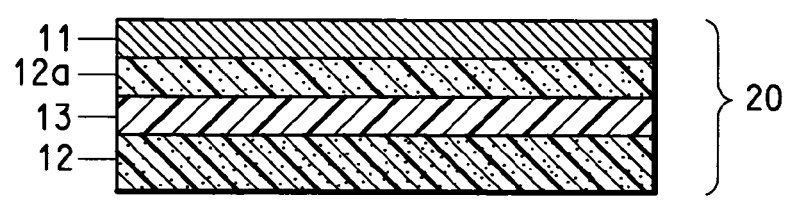
FIG. 2 illustrates a four layer substrate in accordance with the present invention, wherein a second low $T_g$ polyimide layer (12a) is interposed between the conductive layer (11) and the high $T_g$ polyimide layer (13) before lamination of the multi-layer substrate. The first low $T_g$ polyimide layer (12) is on the opposite side of the high $T_g$ polyimide layer (13).
Figure 3:
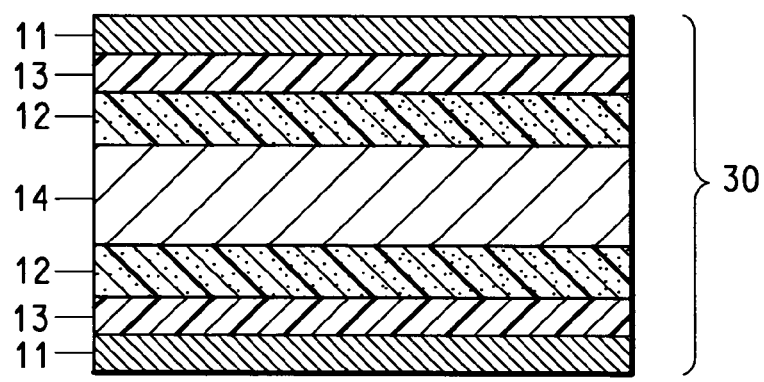
FIG. 3 illustrates a multi-layer substrate in accordance with the present invention, wherein a substrate in accordance with FIG. 1 is placed on at least one (and optionally on both side(s) as seen in FIG. 3) of an inner multi-layer substrate (14), wherein the inner multi-layer substrate (14) may or may not contain a low $T_g$ polyimide layer, a high $T_g$ polyimide layer, a conductive layer, or a combination of two, three, or four of these layers.
Figure 4:
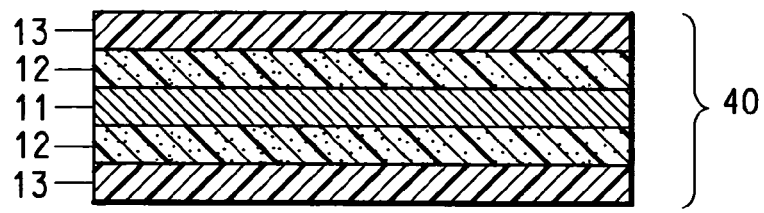
FIG. 4 illustrates a multi-layer substrate in accordance with the present invention wherein a conductive layer (11) is embedded within the multi-layer substrate having adjacent to it, on both sides, low $T_g$ polyimide layers (12), and having bonded to the opposite sides of each low $T_g$ polyimide layer an additional high $T_g$ polyimide layer (13).
Figure 5:
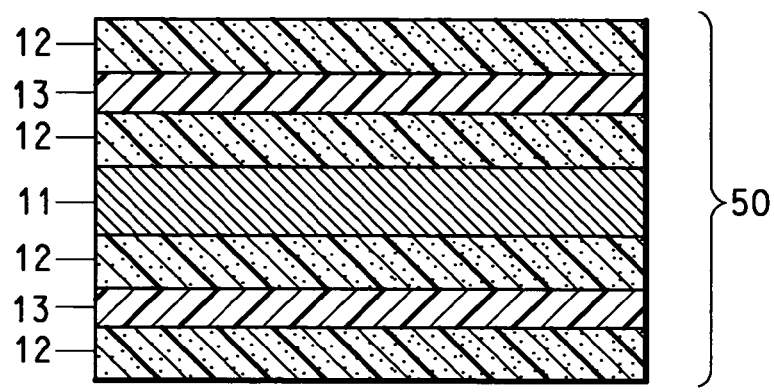
FIG. 5 illustrates a multi-layer substrate in accordance with the present invention wherein a conductive layer (11) is embedded within the multi-layer substrate having adjacent to it, on both sides, low $T_g$ polyimide layers (12), having bonded to the opposite side of each low $T_g$ polyimide layer an additional high $T_g$ polyimide layer (13), and having bonded to the opposite side of each additional high $T_g$ polyimide layer additional low $T_g$ polyimide layers (12).
Figure 6:
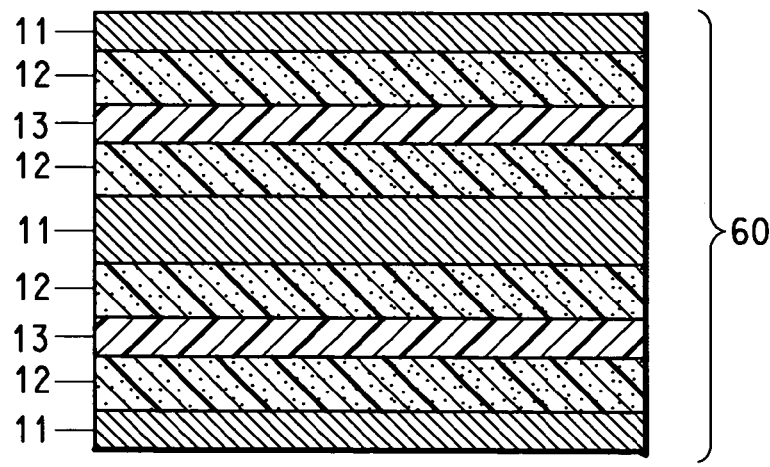
FIG. 6 illustrates a multi-layer substrate in accordance with the present invention wherein a conductive layer (11) is embedded within the multi-layer substrate having adjacent to it, on both sides, low $T_g$ polyimide layers (12), having bonded to the opposite side of each low $T_g$ polyimide layer an additional high $T_g$ polyimide layer (13), having bonded to the opposite side of each high $T_g$ polyimide layer additional low $T_g$ polyimide layers (12), and having bonded to each side of each additional low $T_g$ polyimide layers additional conductive layers (11).

In one embodiment, the multi-layer compositions of the present invention comprise: i. a conductive layer; ii. a high $T_g$ aromatic polyimide layer; and iii. a low $T_g$ aliphatic-aromatic polyimide layer. The polyimide layers of the present invention can be prepared by reacting a mixture of appropriate diamines with a mixture of appropriate dianhydrides in an organic solvent.

In the case of the high $T_g$ polyimide layer, the high $T_g$ base polymer is derived from one or more aromatic dianhydrides and one or more aromatic diamines wherein at least 70, 75, 80, 85, 90, 95, 96, 97, 98, 99 or 100% of the hydrocarbon linkages of the base polymer contribute to an aromatic moiety. The high $T_g$ polyimide layers of the present invention can be a thermoset polyimide or be a polyimide with thermoplastic properties allowing the polyimide to bond to metal (and other substrates). Suitable high $T_g$ polyimides can be derived from dianhydrides such as PMDA, BPDA, BTDA and the like, and diamines such as p-phenylene diamine, m-phenylene diamine, 3,4'-oxydianiline, 4,4'-oxydianiline, and biphenyldiamine.

In one embodiment or the present invention, the high $T_g$ polyimides layers of the present invention have a thickness in a range from about 7.5 to 125 microns. These higher Tg polyimides can be obtained from polyamic acid precursors derived from the reaction of suitable diamines with suitable dianhydrides in the manner described in, for example, U.S. Pat. Nos. 3,179,630, 3,179,633, 3,179,634, 5,166,308, and 5,196,500 incorporated herein by reference.

In the case of the low $T_g$ polyimide layer, the low $T_g$ base polymer is derived from one or more aromatic dianhydrides with at least two types of diamines—aromatic diamine and aliphatic diamine. In one embodiment, substantially all of the diamine is either aliphatic or aromatic, and the mole ratio of aliphatic diamine divided by aromatic diamine is in a range between and including any two of the following: 1.0, 1.5, 2.5, 3.0, 3.5, 4.0, 5.0, 6.0, 7.5, 8.0, 8.5 and 9.0.

I. Organic Solvents

Useful organic solvents for the synthesis of the polyimides of the present invention are preferably capable of dissolving the polyimide precursor materials. Such a solvent should also have a relatively low boiling point, such as below 225° C., so the polyimide can be dried at moderate (i.e., more convenient and less costly) temperatures. A boiling point of less than 210, 205, 200, 195, 190, or 180° C. is preferred.

Solvents of the present invention may be used alone or in combination with other solvents (i.e., cosolvents). Useful organic solvents include: N-methylpyrrolidone (NMP), dimethylacetamide (DMAc), N,N'-dimethyl-formamide (DMF), dimethyl sulfoxide (DMSO), tetramethyl urea (TMU), diethyleneglycol diethyl ether, 1,2-dimethoxyethane (monoglyme), diethylene glycol dimethyl ether(diglyme), 1,2-bis-(2-methoxyethoxy) ethane(triglyme), bis[2-(2-methoxyethoxy)ethyl)]ether(tetraglyme), gamma-butyrolactone, and bis-(2-methoxyethyl)ether, tetrahydrofuran. In one embodiment, preferred solvents include N-methylpyrrolidone (NMP) and dimethylacetamide (DMAc).

Co-solvents can generally be used at about 5 to 50 weight percent of the total solvent, and useful such co-solvents include xylene, toluene, benzene, "Cellosolve" (glycol ethyl ether), and "Cellosolve acetate" (hydroxyethyl acetate glycol monoacetate).

II. Aliphatic Diamines

For the low $T_g$ polyimide base polymer, useful aliphatic diamines have the following structural formula: $H_2N-R-NH_2$, where R is an aliphatic moiety, such as a substituted or unsubstituted hydrocarbon in a range from 4, 5, 6, 7 or 8 carbons to about 9, 10, 11, 12, 13, 14, 15, or 16 carbon atoms, and in one embodiment the aliphatic moiety is a $C_6$ to $C_8$ aliphatic.

In one embodiment, R is a $C_6$ straight chain hydrocarbon, known as hexamethylene diamine (HMD or 1,6-hexanediamine). In other embodiments, the aliphatic diamine is an alpha, omega-diamine; such diamines can be more reactive than alpha, beta-aliphatic diamines.

In one embodiment, to achieve low temperature bonding ("low temperature bonding" is intended to mean bonding in a range of from about 180, 185, or 190° C. to about 195, 200, 205, 210, 215, 220, 225, 230, 235, 240, 245 and 250° C.), the mole % of aliphatic diamine (based upon total diamine) is in a range from about 50, 55, 60, 65, or 70 to about 75, 80, 85 or 90 mole %. In this embodiment, if less than 50 mole % of the diamine component is aliphatic diamine, the resulting polyimide can sometimes have an unduly high glass transition temperature ("$T_g$") which can be detrimental to low temperature bonding. In one embodiment, if more than 90 mole % of the diamine component is an aliphatic diamine, then any resulting polyimide film can become too brittle for some flexible material applications.

In one embodiment, as the aliphatic diamine to aromatic diamine ratio increases, the glass transition temperature ($T_g$) of the polyimide, and lamination temperature will generally tend to decrease. In one embodiment, for bonding to metal to properly occur, the lamination temperature is typically about 25° C. higher than the glass transition temperature of the polyimide adhesive. For example, if the glass transition temperature of the polyimide is in the range of about 150° C. to 200° C., then the optimal bonding temperature will be in the range of about 180° C. to 250° C.

In one embodiment, the aliphatic diamine is 75±10, 8, 6, 4, 2 or 1 mole % hexamethylene diamine (HMD) and the aromatic diamine is 25±10, 8, 6, 4, 2 or 1 mole %, 1,3-bis-(4-aminophenoxy)benzene (APB-134, RODA). Here, the glass transition temperature of the polyimide adhesive is in a range of about 175±10° C. At a lamination temperature (bonding temperature) of about 200±10, 8, 6, 4, 2 or 1° C., the polyimide adhesive can be a viable substitute for an acrylic or epoxy coverlay composition, compositions commonly used as conformal coatings and encapsulates in electronics applications.

Depending upon the particular embodiment of the present invention, other suitable aliphatic diamines include, 1,4-tetramethylenediamine, 1,5-pentamethylenediamine (PMD), 1,7-heptamethylene diamine, 1,8-octamethylenediamine, 1,9-nonamethylenediamine, 1,10-decamethylenediamine (DMD), 1,11-undecamethylenediamine, 1,12-dodecamethylenediamine (DDD), 1,16-hexadecamethylenediamine. The preferred aliphatic diamine is hexamethylene diamine (HMD).

III. Aromatic Diamines

For either the low $T_g$ or the high $T_g$ polyimide base polymer, suitable aromatic diamines include, m-phenylenediamine, p-phenylenediamine, 2,5-dimethyl-1,4-diaminobenzene, trifluoromethyl-2,4-diaminobenzene, trifluoromethyl-3,5-diaminobenzene, 2,5-dimethyl-1,4-phenylenediamine (DPX), 2,2-bis-(4-aminophenyl)propane, 4,4'-diaminobiphenyl, 4,4'-diaminobenzophenone, 4,4'-diaminodiphenylmethane, 4,4'-diaminodiphenyl sulfide, 4,4'-diaminodiphenyl sulfone, 3,3'-diaminodiphenyl sulfone, bis-(4-(4-aminophenoxy)phenyl sulfone (BAPS), 4,4'-bis-(aminophenoxy)biphenyl (BAPB), 4,4'-diaminodiphenyl ether, 3,4'-diaminodiphenyl ether, 4,4'-diaminobenzophenone, 4,4'-isopropylidenedianiline, 2,2'-bis-(3-aminophenyl)propane, N,N-bis-(4-aminophenyl)-n-butylamine, N,N-bis-(4-aminophenyl)methylamine, 1,5-diaminonaphthalene, 3,3'-dimethyl-4,4'-diaminobiphenyl, m-amino benzoyl-p-amino anilide, 4-aminophenyl-3-aminobenzoate, N,N-bis-(4-aminophenyl) aniline, 2,4-diaminotoluene, 2,5-diaminotoluene, 2,6-diaminotoluene, 2,4-diamine-5-chlorotoluene, 2,4-diamine-6-chlorotoluene, 2,4-bis-(beta-amino-t-butyl) toluene, bis-(p-beta-amino-t-butyl phenyl ether, p-bis-2-(2-methyl-4-aminopentyl)benzene, m-xylylene diamine, and p-xylylene diamine.

Other useful aromatic diamines include, 1,2-bis-(4-aminophenoxy)benzene, 1,3-bis-(4-aminophenoxy)benzene, 1,2-bis-(3-aminophenoxy)benzene, 1,3-bis-(3-aminophenoxy)benzene, 1-(4-aminophenoxy)-3-(3-aminophenoxy) benzene, 1,4-bis-(4-aminophenoxy) benzene, 1,4-bis-(3-aminophenoxy)benzene, 1-(4-aminophenoxy)-4-(3-aminophenoxy) benzene, 2,2-bis-(4-[4-aminophenoxy] phenyl)propane (BAPP), 2,2'-bis-(4-aminophenyl)-hexafluoro propane (6F diamine), 2,2'-bis-(4-phenoxy aniline)isopropylidene, 2,4,6-trimethyl-1,3-diaminobenzene, 4,4'-diamino-2,2'-trifluoromethyl diphenyloxide, 3,3'-diamino-5,5'-trifluoromethyl diphenyloxide, 4,4'-trifluoromethyl-2,2'-diaminobiphenyl, 2,4,6-trimethyl-1,3-diaminobenzene, 4,4'-oxy-bis-[2-trifluoromethyl)benzene amine] (1,2,4-OBABTF), 4,4'-oxy-bis-[3-trifluoromethyl) benzene amine], 4,4'-thio-bis-[(2-trifluoromethyl)benzene amine], 4,4'-thiobis[(3-trifluoromethyl)benzene amine], 4,4'-sulfoxyl-bis-[(2-trifluoromethyl)benzene amine, 4,4'-sulfoxyl-bis-[(3-trifluoromethyl)benzene amine], and 4,4'-keto-bis-[(2-trifluoromethyl)benzene amine].

In one embodiment, useful aromatic diamines include the isomers of bis-aminophenoxybenzenes (APB), aminophenoxyphenylpropane (BAPP), dimethylphenylenediamine (DPX), bisaniline P, and combinations thereof, and the use of these particular aromatic diamines can lower the lamination temperature of the polyimide, and can increase the peel strength of the polyimide to other materials, especially metals.

IV. Aromatic Dianhydrides

In one embodiment, any aromatic dianhydride or combination of aromatic dianhydrides, can be used as the dianhydride monomer in forming the high $T_g$ or low $T_g$ polyimide. These dianhydrides may be used alone or in combination with one another. The dianhydrides can be used in their tetra-acid form (or as mono, di, tri, or tetra esters of the tetra acid), or as their diester acid halides (chlorides). However in some embodiments, the dianhydride form can be preferred, because it is generally more reactive than the acid or the ester.

Examples of suitable aromatic dianhydrides include, 1,2, 5,6-naphthalene tetracarboxylic dianhydride, 1,4,5,8-naphthalene tetracarboxylic dianhydride, 2,3,6,7-naphthalene tetracarboxylic dianhydride, 2-(3',4'-dicarboxyphenyl)5,6-dicarboxybenzimidazole dianhydride, 2-(3',4'-dicarboxyphenyl)5,6-dicarboxybenzoxazole dianhydride, 2-(3',4'-dicarboxyphenyl)5,6-dicarboxybenzothiazole dianhydride, 2,2',3,3'-benzophenone tetracarboxylic dianhydride, 2,3,3',4'-benzophenone tetracarboxylic dianhydride, 3,3',4,4'-benzophenone tetracarboxylic dianhydride (BTDA), 2,2',3,3'-biphenyl tetracarboxylic dianhydride, 2,3,3',4'-biphenyl tetracarboxylic dianhydride, 3,3',4,4'-biphenyl tetracarboxylic dianhydride (BPDA), bicyclo-[2,2,2]-octen-(7)-2,3,5,6-tetracarboxylic-2,3,5,6-dianhydride, 4,4'-thio-diphthalic anhydride, bis(3,4-dicarboxyphenyl)sulfone dianhydride, bis(3,4-dicarboxyphenyl) sulfoxide dianhydride (DSDA), bis(3,4-dicarboxyphenyl oxadiazole-1,3,4) p-phenylene dianhydride, bis(3,4-dicarboxyphenyl)2,5-oxadiazole1,3,4-dianhydride, bis 2,5-(3',4'-dicarboxydiphenylether)1,3,4-oxadiazole dianhydride, 4,4'-oxydiphthalic anhydride (ODPA), bis(3,4-dicarboxyphenyl) thio ether dianhydride, bisphenol A dianhydride (BPADA), bisphenol S dianhydride, 2,2-bis-(3,4-dicarboxyphenyl) 1,1,1,3,3,3,-hexafluoropropane dianhydride (6FDA), 5,5-[2,2,2]-trifluoro-1-(trifluoromethyl)ethylidene, bis-1,3-isobenzofurandione, 1,4-bis(4,4'-oxyphthalic anhydride) benzene, bis(3,4-dicarboxyphenyl)methane dianhydride, cyclopentadienyl tetracarboxylic acid dianhydride, cyclopentane tetracarboxylic dianhydride, ethylene tetracarboxylic acid dianhydride, perylene 3,4,9,10-tetracarboxylic dianhydride, pyromellitic dianhydride (PMDA), tetrahydrofuran tetracarboxylic dianhydride, 1,3-bis-(4,4'-oxydiphtalic anhydride) benzene, 2,2-bis(3,4-dicarboxyphenyl) propane dianhydride, 2,6-dichloronaphthalene-1,4,5,8-tetracarboxylic dianhydride, 2,7-dichloronaphthalene-1,4,5,8-tetracarboxylic dianhydride, 2,3,6,7-tetrachloronaphthalene-1,4,5,8-tetracarboxylic dianhydride, phenanthrene-1,8,9,10-tetracarboxylic dianhydride, pyrazine-2,3,5,6-tetracarboxylic dianhydride, benzene-1,2,3,4-tetracarboxylic dianhydride; and thiophene-2,3,4,5-tetracarboxylic dianhydride.

In this embodiment, the preferred dianhydrides are BTDA and BPDA as they are readily available and have been found to provide excellent properties.

V. Preparation of the low $T_g$ Polyimide Layer and the High $T_g$ Polyimide Layer.

Polyimide film layers according to the present invention can be produced by combining the diamine and dianhydride (monomer or other polyimide precursor form) together with a solvent to form a polyamic acid (also called a polyamide acid) solution. The dianhydride and diamine can be combined in a molar ratio of about 0.90 to 1.10. Molecular weight of the polyamic acid formed therefrom can be adjusted by adjusting the molar ratio of the dianhydride and diamine.

In one embodiment, a polyamic acid casting solution is derived from the polyamic acid solution. The polyamic acid casting solution preferably comprises the polyamic acid solution combined with conversion chemicals like: (i.) one or more dehydrating agents, such as, aliphatic acid anhydrides (acetic anhydride, etc.) and/or aromatic acid anhydrides; and (ii.) one or more catalysts, such as, aliphatic tertiary amines (triethyl amine, etc.), aromatic tertiary amines (dimethyl aniline, etc.) and heterocyclic tertiary amines (pyridine, picoline, isoquinoline, etc.). The anhydride dehydrating material it is often used in molar excess compared to the amount of amide acid groups in the polyamic acid. The amount of acetic anhydride used is typically about 2.0-3.0 moles per equivalent of polyamic acid. Generally, a comparable amount of tertiary amine catalyst is used.

In one embodiment, the polyamic acid solution, and/or the polyamic acid casting solution, is dissolved in an organic solvent at a concentration from about 5.0 or 10% to about 15, 20, 25, 30, 35 and 40% by weight.

The polyamic acid (and casting solution) can further comprise any one of a number of additives, such as processing aids (e.g., oligomers), antioxidants, light stabilizers, flame retardant additives, anti-static agents, heat stabilizers, ultraviolet absorbing agents, inorganic fillers or various reinforcing agents. These inorganic fillers include thermally conductive fillers, like metal oxides, and electrically conductive fillers like metals and electrically conductive polymers. Common inorganic fillers are alumina, silica, silicon carbide, diamond, clay, boron nitride, aluminum nitride, titanium dioxide, dicalcium phosphate, and fumed metal oxides. Common organic fillers include polyaniline, polythiophene, polypyrrole, polyphenylenevinylene, polydialkylfluorenes, carbon black, and graphite.

The solvated mixture (the polyamic acid casting solution) can then be cast or applied onto a support, such as an endless belt or rotating drum, to give a film. Next, the solvent containing-film can be converted into a self-supporting film by baking at an appropriate temperature (thermal curing) together with conversion chemical reactants (chemical curing). The film can then be separated from the support, oriented such as by tentering, with continued thermal and chemical curing to provide a polyimide film.

Useful methods for producing polyimide film in accordance with the present invention can be found in U.S. Pat. No. 5,166,308 and U.S. Pat. No. 5,298,331 are incorporate by reference into this specification for all teachings therein. Numerous variations are also possible, such as, (a.) A method wherein the diamine components and dianhydride components are preliminarily mixed together and then the mixture is added in portions to a solvent while stirring.

(b.) A method wherein a solvent is added to a stirring mixture of diamine and dianhydride components. (contrary to (a) above)

(c.) A method wherein diamines are exclusively dissolved in a solvent and then dianhydrides are added thereto at such a ratio as allowing to control the reaction rate.

(d.) A method wherein the dianhydride components are exclusively dissolved in a solvent and then amine components are added thereto at such a ratio to allow control of the reaction rate.

(e.) A method wherein the diamine components and the dianhydride components are separately dissolved in solvents and then these solutions are mixed in a reactor.

(f.) A method wherein the polyamic acid with excessive amine component and another polyamic acid with excessive dianhydride component are preliminarily formed and then reacted with each other in a reactor, particularly in such a way as to create a non-random or block copolymer.

(g.) A method wherein a specific portion of the amine components and the dianhydride components are first reacted and then the residual diamine components are reacted, or vice versa.

(h.) A method wherein the conversion chemicals are mixed with the polyamic acid to form a polyamic acid casting solution and then cast to form a gel film.

(i.) A method wherein the components are added in part or in whole in any order to either part or whole of the solvent, also where part or all of any component can be added as a solution in part or all of the solvent.

(j.) A method of first reacting one of the dianhydride components with one of the diamine components giving a first polyamic acid. Then reacting the other dianhydride component with the other amine component to give a second polyamic acid. Then combining the amic acids in any one of a number of ways prior to film formation.

The thickness of each polyimide layer may be adjusted, depending on the intended purpose of the film or final application specifications. It is generally preferred that the thickness of each polyimide layer range from 2, 3, 5, 7, 8, 10, 12, 15, 20, or 25 microns to about 25, 30, 35, 40, 45, 50, 60, 80, 100, 125, 150, 175, 200, 300, 400 or 500 microns. Preferably, the thickness is from about 8 to about 125 microns, more preferably from 12 to 25 microns.

In one embodiment, the polyimide layers according to the present invention are used in a multi-layer substrate format for incorporation into at least a portion (or a precursor) of a flexible printed circuit board ("FPC"), chip scale package, wafer scale package or other similar-type electronic substrate. In one embodiment, a flexible printed circuit board ("FPC") can be produced as follows:

1. laminating a copper or other conductive foil (or conductive layer) to a high $T_g$ polyimide film, 2. laminating a low $T_g$ polyimide film to the opposite side of the high $T_g$ polyimide layer; and 3. forming a circuit pattern on the copper (broadly speaking: application of a resist, photo-patterning and development of the resist, copper etching and removal of the resist).

In one embodiment, the low $T_g$ polyimide films of the present invention are used as a coverlay film. Coverlay films are laminated to etched circuitry traces (metal traces) of a flexible printed circuit board. The low $T_g$ polyimide layer can be used to encapsulate the copper circuitry, protecting it from the environment and providing electrical and thermal insulation. The flexible printed circuit board (covered with the films of the present invention) may be single sided, double sided, or be incorporated into a stack of several individual flexible printed circuits to form what is commonly referred to as a multi-layer board. Any of these types of circuits may be used in a solely flexible printed circuit or may be combined with rigid circuitry applications to form a rigid/flex or flex/rigid printed wiring board.

In one embodiment, the high $T_g$ polyimide layer and the low $T_g$ polyimide layer can be simultaneously solution cast by co-extrusion. At the time of casting, the polyimides can be in the form of a polyamic acid solution. The cast solutions form an uncured polyamic acid film that is later cured to a polyimide. The adhesion strength of such laminates can be improved by employing various techniques for elevating adhesion strength.

For example, prior to the step of applying the high or the low Tg polyimide layers of the present invention onto a metal foil (or the exposed circuitry in a coverlay application), the polyimide film can be subjected to a pre-treatment step. These pre-treatment steps include, heat treatment, corona treatment, plasma treatment under atmospheric pressure, plasma treatment under reduced pressure, treatment with coupling agents like silanes and titanates, sandblasting, alkali-treatment, acid-treatments, and coating polyamic acids. To improve the adhesion strength, it is generally also possible to add various metal compounds as disclosed in U.S. Pat. Nos. 4,742,099; 5,227,244; 5,218,034; and 5,543,222 incorporated herein by reference.

In addition, (for purposes of improving adhesion) the conductive metal surface may be treated with various organic and inorganic treatments. These treatments include using silanes, imidazoles, triazoles, oxide and reduced oxide treatments, tin oxide treatment, and surface cleaning/roughening (called micro-etching) via acid or alkaline reagents.

The low Tg polyimides of the present invention can also be applied to fully cured high Tg polyimide layers or can be applied to one of the intermediate manufacturing stages of polyimide film such as to "gel" film or to "green" film.

The term "gel" film refers to a polyamic acid sheet, which is laden with volatiles, primarily solvent, to such an extent that the polyamic acid is in a gel-swollen, or rubbery condition. The volatile content is usually in the range of 70 to 90% by weight and the polymer content usually in the range of 10 to 30% by weight of the gel film. The final film becomes "self-supporting" in the gel film stage. It can be stripped from the support on which it was cast and heated to a final curing temperature. The gel film generally has an amic acid to imide ratio between 10:90 and 50:50, most often 30:70.

The gel film structure can be prepared by the method described in U.S. Pat. No. 3,410,826. This patent discloses mixing a chemical converting agent and a catalyst such as a lower fatty acid anhydride and a tertiary amine, into the polyamic-acid solution at a low temperature. This is followed by casting the polyamic-acid solution in film-form, onto a casting drum. The film is mildly heated after casting, at for example 100° C., to activate the conversion agent and catalyst in order to transform the cast film to a polyamic acid/polyimide gel film.

Another type of polyimide base film, is a "green film" which is partially polyamic acid and partially polyimide. Green film contains generally about 50 to 75% by weight polymer and 25 to 50% by weight solvent. Generally, it should be sufficiently strong to be substantially self-supporting. Green film can be prepared by casting the polyamic acid solution into film form onto a suitable support such as a casting drum or belt and removing the solvent by mild heating at up to 150° C. A low proportion of amic acid units in the polymer, e.g., up to 25%, may be converted to imide units.

Application of the polyimide films of the present invention can be accomplished in any number of ways. Such methods include using a slot die, dip coating, or kiss-roll coating a film followed by metering with doctor knife, doctor rolls, squeeze rolls, or an air knife. The coating may also be applied by brushing or spraying. By using such techniques, it is possible to prepare both one and two-sided coated laminates. In preparation of the two-side coated structures, one can apply the coatings to the two sides of a polyimide either simultaneously or consecutively before going to the curing and drying stage of the polyimide.

In a further embodiment, the polyamic acid precursor (to a polyimide film of the present invention) may be coated on a fully cured polyimide base film or directly on a metal substrate and subsequently imidized by heat treatment. The polyimide base film may be prepared by either a chemical or thermal conversion process and may be surface treated, e.g. by chemical etching, corona treatment, laser etching etc., to improve adhesion.

As used herein, the term "conductive layers" and "conductive foils" mean metal layers or metal foils (thin compositions having at least 50% of the electrical conductivity of a high-grade copper). Conductive foils are typically metal foils. Metal foils do not have to be used as elements in pure form; they may also be used as metal foil alloys, such as copper alloys containing nickel, chromium, iron, and other metals. The conductive layers may also be alloys of metals and are typically applied to the polyimides of the present invention via a sputtering step followed by an electroplating step. In these types of processes, a metal seed coat layer is first sputtered onto a polyimide film. Finally, a thicker coating of metal is applied to the seed coat via electroplating or electro-deposition. Such sputtered metal layers may also be hot pressed above the glass transition temperature of the polymer for enhanced peel strength.

Particularly suitable metallic substrates are foils of rolled, annealed copper or rolled, annealed copper alloy. In many cases, it has proved to be of advantage to pre-treating the metallic substrate before coating. This pretreatment may include, but is not limited to, electro-deposition or immersion-deposition on the metal of a thin layer of copper, zinc, chrome, tin, nickel, cobalt, other metals, and alloys of these metals. The pretreatment may consist of a chemical treatment or a mechanical roughening treatment. It has been found that this pretreatment enables the adhesion of the polyimide layer and, hence, the peel strength to be further increased. Apart from roughening the surface, the chemical pretreatment may also lead to the formation of metal oxide groups, enabling the adhesion of the metal to a polyimide layer to be further increased. This pretreatment may be applied to both sides of the metal, enabling enhanced adhesion to substrates on both sides.

A polyimide multi-clad of the present invention comprising a double side copper clad can be prepared by laminating copper foil to both sides of a substrate comprising a high Tg polyimide layer, a low Tg polyimide layer, or a conductive layer. The construction can also be made by laminating a high Tg polyimide layer (having a copper foil coated on an opposite side) to a low Tg polyimide film.

In modern circuitry applications z-directional dimensional stability (through the film thickness), especially in films where the dielectric is less than 25 microns, is increasingly important. The films of the present invention generally have excellent z-axis dimensional stability (z-axis coefficient of thermal expansion) by providing a expansion factor of less than 120 ppm/° C., typically 90 ppm/° C. The coefficient of thermal expansion is measured by ASTM Method IPC-650 2.4.41 and is included herein by reference.

In addition, the polyimide substrates of the present invention generally also have a low loss-tangent value. Loss-tangent is typically measured at 10 GHz and is used to measure a dielectric material's degradation of a nearby digital signal that is passing through a metal circuit trace. Different loss-tangent values exist for different dielectric materials. The lower the loss-tangent value for a given dielectric material, the increasingly) superior a material is for digital circuitry applications. The polyimides of the present invention exhibit excellent, low loss-tangent values. In one embodiment, the loss-tangent value for the polyimide layers was less than 0.010, about 0.004, at 10 GHz. The polyimides of present invention may also be used in applications ranging from 1 to 100 GHz, with 1 to 20 GHz being most common.

In another embodiment, the multi-layer polyimides of the present invention are used as a material to construct a planar transformer component. These planar transformer components are commonly used in power supply devices.

In yet another embodiment, the polyimide films of the present invention may be used with thick metal foils to form flexible heaters. These heaters are typically used in automotive and aerospace applications.

The multi-layer films of the present invention exhibit excellent attenuation. The polyimides of the present invention can often exhibit an attenuation value, measured in decibels per inch, of about 0.3 at 10 GHz using a 50-ohm micro strip.

In one embodiment of the present invention, a low $T_g$ polyimide precursor and a high $T_g$ polyimide precursor are cast simultaneously (using a multi-port die) to form two layer and/or three layer polyimides (after curing of the polyamic acid layers). These multi-layer polyimides are then bonded to metal using the low $T_g$ polyimide layer as the bonding layer to the metal, or using electroless sputtering and plating of a metal layer onto the high $T_g$ polyimide layer. Thus, the polyimide film metal-clad laminates formed comprise at least one layer of a high $T_g$ polyimide base film, at least one layer of low Tg polyimide film, and a conductive layer. Bonding of the multi-layer polyimide-metal clad laminates, when a metal foil is used as the conductive layer, can take place in a double belt press in roll to roll processing, or in an autoclave in sheet to sheet processing.

In one embodiment of the present invention, the high $T_g$ polyimide layer of the present invention is directly adjacent to a metal layer. The metal layer is formed on the high $T_g$ polyimide by forming a seed layer of metal via a sputter coat step and then plating additional metal to the seed coat to form a polyimide metal-clad laminate. A low $T_g$ polyimide layer is then bonded to the opposite side of the high $T_g$ polyimide layer.

Yet, another method of forming a polyimide film metal-clad laminate of the present invention is to bond an already formed high $T_g$ polyimide to a conductive layer to form a one-sided polyimide metal clad laminate. A low $T_g$ polyimide layer (i.e. typically in the form of a polyimide precursor) is then coated onto the high $T_g$ polyimide layer whereby the low $T_g$ polyimide layer is later cured to a polyimide.

In some cases, one or more additional high or low $T_g$ polyimide layers, or additional conductive layers, are also incorporated into the multi-layer structure. Optionally (or in the alternative) two or more layers of metal or two or more layers of high or low Tg polyimide may be employed.

The polyimides of the present invention are particularly useful for die pad bonding of flexible print connection boards or semiconductor devices or packaging materials for CSP (chip scale package), chip on flex (COF), COL (chip on lead), LOC (lead on chip), multi-chip module ("MCM"), ball grid array ("BGA" or micro-ball grid array), and/or tape automated bonding ("TAB").

In one embodiment, the present invention includes a method for bonding an integrated circuit chip to a lead frame. The method includes first preparing a solution in an organic solvent of a polyamic acid comprising the reaction product of components comprising an aromatic dianhydride and aromatic diamine. Next, the polyamic acid is applied to either the integrated circuit chip or the lead frame, between which is also the low Tg polyimide layer (in a polyamic acid precursor stage, a final polyimide or any intermediate stage there between). Under heat, the organic solvent is removed and the polyamic acid is converted via imidization to a polyimide. Then, under pressure and heat, the integrated circuit chip and lead frame are bonded together with a high $T_g$ polyimide layer (the opposite side of the multi-layer being bonded to either the integrated circuit or the lead frame or both).

In another embodiment, the multi-layer polyimide films of the present invention are used for wafer level integrated circuit packaging, where a composite is made comprising a substrate according to the present invention interposed between a conductive layer (typically a metal) having a thickness of less than 100 microns, and a wafer comprising a plurality of integrated circuit dies. Here, either the high or low $T_g$ layer of the present invention can be used as the adhesive layer that bonds to the conductive layer. In one (wafer level integrated circuit packaging) embodiment, the conductive passageway is connected to the dies by a conductive passageway, such as a wire bond, a conductive metal, a solder bump or the like.

In some embodiments of the present invention, all (or part) of the high $T_g$ polyimide base polymer can be replaced with a different polymer (where the properties of a high $T_g$ polyimide are not strictly required), provided such different polymer has a high temperature (>200° C.) softening point. Useful such alternative polymers can include fluoropolymers, liquid crystal polymers and the like.

In addition (or alternatively), in some embodiments of the present invention, all or part of the low $T_g$ polyimide base polymer can be replaced with a different polymer, depending upon the particular end-use application, provided such different polymer has a low temperature (<200° C.) softening point. In one such alternative embodiment, a 2 or 3-layer composite film can be constructed with a thin (2-50 µm) first dielectric layer of fluoropolymer (such as, polytetrafluroethylene) or liquid crystal polymer, having softening point >200° C., with a thin (2-50 micron) side layer on one or both sides, the side dielectric layer(s) comprising fluoropolymer (such as, polytetrafluoroethylene) or liquid crystal polymer with a low temperature (<200° C.) softening point. In such embodiments, the multi-layer substrates can often be used as a packaging substrate for electronic devices and can for example, be created by using a sequential build-up (SBU) micro-via process. In such an (SBU) process, the dielectric material can be laminated on both sides of a pre-circuitized organic core material (like BT-Epoxy-Glass core or FR-4 Core) with laser induced microvias (10-100 µm in diameter) in the dielectric material. The microvias can be used in the fabrication of copper interconnects, such as, by using a known industry process, commonly referred to as Semi-additive Processing (SAP).

The advantageous properties of this invention can be observed by reference to the following examples that illustrate, but do not limit, the invention. All parts and percentages are by weight unless other wise indicated.

EXAMPLES

Polyamic acid solutions for producing the low $T_g$ polyimides of the present invention were prepared by a chemical reaction between the appropriate molar equivalents of the monomers in dimethylacetamide (DMAc) solvent. Typically, the diamine dissolved in DMAc was stirred under nitrogen, and the dianhydride was added as a solid over a period of several minutes. Stirring was continued to obtain maximum viscosity of the polyamic acid. The viscosity was adjusted by controlling the amount of dianhydride in the polyamic acid composition.

The polyamic acids were coated on a fully cured corona treated polyimide base film derived from pyromellitic dianhydride and 4,4'-diaminodiphenyl ether. The polyamic acids were converted to polyimide either by a thermal conversion process or by a chemical conversion process using acetic anhydride as a dehydrating agent and beta-picoline as a catalyst.

The polyamic acids were coated on the base polyimide film using a coating bar to a thickness of 0.5 mils and the solvent removed by heating, although coating thicknesses of from about 5, 7.5, 10, 12.5, 15, 17.5, 20, 22.5 or 25 to about 30, 35, 40, 45, 50, 60, 70, 80 or more microns can be appropriate, depending upon the particular embodiment. The coated polyimide films were placed on a pin frame and cured.

The coated polyimide films can generally be subsequently laminated to roll-annealed copper at temperatures of 180° C. to 250° C. to form a low $T_g$ polyimide/high $T_g$ polyimide/metal clad or a high $T_g$ polyimide/low $T_g$ polyimide/metal clad.

Examples 1-9

1,3-bis-(4-aminophenoxy)benzene (APB-134) and 1,6-hexanediamine (HMD) were dissolved in dry dimethylacetamide (DMAc) solvent using a 1-liter beaker. The beaker was placed in a dry box. The mixture was stirred well and the temperature raised to 50° C.

A mixture of biphenyltetracarboxylic dianhydride (BPDA) and benzophenone tetracarboxylic dianhydride (BTDA) was prepared as the dianhydride mixture. Ninety-five percent by weight of the dianhydride mixture was added slowly to the diamine, over a period of 10 minutes.

The exothermic reaction was allowed to rise to 80° C. to ensure complete reaction of the diamines and dianhydrides to form a polyamic acid solution. The viscosity of the polyamic acid was adjusted, by adding a portion of the remaining dianhydride, to a desirable value anywhere from 50 poise to 1000 poise. The polyamic acid solution was stirred for an additional 1 hour at 35° C.

A small portion of the polyamic acid solution was cast on a glass plate. The casting was dried on a hot plate at 80° C. for 30 minutes. A two mil (two thousands of an inch) thick film was produced.

The film was peeled from the glass plate and placed on a steel pin frame. Then the film was dried (and partially cured) in a high temperature oven. The starting temperature was 80° C., and temperature was increased to 250° C. at a rate of 5° C./min. The film was removed from the oven and cured for an additional 5.0 minutes in an oven set at 330° C.

What is claimed is:

1. A multi-layer substrate, comprising:
   a. a low glass transition temperature polyimide layer comprising a polyimide base polymer synthesized by contacting an aromatic dianhydride with a diamine component in a molar ratio of dianhydride to diamine from 0.9 to 1.1, the diamine component comprising about 50 to about 90 mole % aliphatic diamine and about 10 to about 50 mole % aromatic diamine, said polyimide base polymer having a glass transition temperature from about 150 to about 200° C.;
   b. a high glass transition temperature polyimide layer having a glass transition temperature above the low glass transition temperature polyimide layer, wherein the difference in lamination temperature between the high glass transition temperature layer and the low glass transition temperature layer is in a range between and including 10 and 200° C.; and
   c. a conductive layer,
wherein the low glass transition temperature polyimide layer has a z-axis coefficient of thermal expansion of less than 150 ppm/° C. according to ASTM Method IPC-650 2.4.41, and wherein the high glass transition temperature polyimide layer is between the conductive layer and the low glass transition polyimide layer.

2. A multi-layer substrate in accordance with claim 1 further comprising a second low glass transition temperature polyimide layer located between the conductive layer and the high glass transition temperature polyimide layer.

3. A multi-layer substrate in accordance with claim 1, wherein the aliphatic diamine has the structural formula $H_2N$—$R_1$—$NH_2$, where $R_1$ is a substituted or unsubstituted hydrocarbon from $C_4$ to $C_{16}$.

4. A multi-layer substrate in accordance with claim 1, wherein the aliphatic diamine has the structural formula $H_2N$—$R_2$—$NH_2$, where $R_2$ is a hydrocarbon from $C_6$ to $C_8$.

5. A multi-layer substrate in accordance with claim 1, wherein the aliphatic diamine is selected from the group consisting of 1,4-tetramethylenediamine, 1,5-pentamethylenediamine (PMD), 1,7-heptamethylene diamine, 1,8-octamethylenediamine, 1,9-nonamethylenediamine, 1,10-decamethylenediamine (DMD), 1,11-undecamethylenediamine, 1,12-dodecamethylenediamine (DDD), and 1,16-hexadecamethylenediamine.

6. A multi-layer substrate in accordance with claim 1, wherein the aromatic diamine is selected from the group consisting of 1,2-bis-(4-aminophenoxy) benzene, 1,3-bis-(4-aminophenoxy) benzene, 1,2-bis-(3-aminophenoxy)benzene, 1,3-bis-(3-aminophenoxy) benzene, 1-(4-aminophenoxy)-3-(3-aminophenoxy) benzene, 1,4-bis-(4-aminophenoxy) benzene, 1,4-bis-(3-aminophenoxy) benzene, and (4-aminophenoxy)-4-(3-aminophenoxy) benzene, 2,2-bis-(4-[4-aminophenoxy]phenyl) propane (BAPP), and 2,5-dimethyl-1,4-phenylenediamine (DPX).

7. A multi-layer substrate in accordance with claim 1, wherein the aromatic dianhydride is selected from the group consisting of 2,2',3,3'-benzophenone tetracarboxylic dianhydride, 2,3,3',4'-benzophenone tetracarboxylic dianhydride, 3,3',4,4'-benzophenone tetracarboxylic dianhydride (BTDA), 2,2',3,3'-biphenyl tetracarboxylic dianhydride, 2,3,3',4'-biphenyl tetracarboxylic dianhydride, 3,3',4,4'-biphenyl tetracarboxylic dianhydride (BPDA), 4,4'-oxydiphthalic anhydride (ODPA), 2,2-bis-(3,4-dicarboxyphenyl) 1,1,1,3,3,3,-hexafluoropropane dianhydride (6FDA), pyromellitic dianhydride (PMDA), and tetrahydrofuran tetracarboxylic dianhydride.

8. A multi-layer substrate in accordance with claim 1, wherein the aliphatic diamine is hexamethylene diamine (HMD), wherein the aromatic diamine is 1,3-bis-(4-aminophenoxy) benzene, and wherein the aromatic dianhydride is a combination of 3,3',4,4'-benzophenone tetracarboxylic dianhydride (BTDA) and 3,3',4,4'-biphenyl tetracarboxylic dianhydride (BPDA).

9. A multi-layer substrate in accordance with claim 1, wherein the aromatic dianhydride component is 70 to 95 mole % 3,3',4,4'-biphenyltetracarboxylic dianhydride (BPDA) and 5 to 30 mole % 3,3',4,4'-benzophenonetetracarboxylic dianhydride (BTDA), and wherein the diamine component is 60 to 80 mole % hexamethylene diamine (HMD) and 20 to 40 mole % 1,3-bis-(4-aminophenoxy) benzene (APB-134, RODA).

10. A multi-layer substrate in accordance with claim 1, wherein a surface of the conductive layer is in direct contact with the high glass transition temperature polyimide layer.

11. A multi-layer substrate in accordance with claim 8, wherein a surface of the low glass transition temperature polyimide layer is in direct contact with the high glass transition temperature polyimide layer.

12. A multi-layer substrate in accordance with claim 1, further comprising one or more additional conductive layers.

13. A multi-layer substrate in accordance with claim 1, wherein the substrate is at least: i. a component of; or ii. a precursor to, a packaging composition, the packaging composition being a chip on lead package, a chip on flex package, a lead on chip package, a multi-chip module package, a ball grid array package, chip scale package, a tape automated bonding package, or a package comprising a micro-via.

14. A multi-layer substrate in accordance with claim 1, wherein the substrate is a component of a wafer level integrated circuit packaging comprising a conductive passageway, said conductive passageway being at least a portion of one or more members of the group consisting of: a wire bond, a conductive metal, and a solder bump.

15. A multi-layer substrate in accordance with claim 1 further comprising a filler material selected from the group consisting of alumina, silica, boron nitride, silicon carbide, clay, diamond, dicalcium phosphate, aluminum nitride, titanium dioxide, polyaniline, polythiophene, polypyrrole, polyphenylenevinylene, polydialkylfluorenes, carbon black, and graphite.

16. A sequential build-up (SBU) micro-via integrated circuit packaging substrate, consisting essentially of:
   a) a first layer, the first layer comprising a low glass transition temperature polyimide layer comprising a polyimide base polymer synthesized by contacting an aromatic dianhydride with a diamine component in a molar ratio of dianhydride to diamine from 0.9 to 1.1, the diamine component comprising about 50 to about 90 mole % aliphatic diamine and about 10 to about 50 mole % aromatic diamine, said polyimide base polymer having a glass transition temperature from about 150 to about 200° C.;
   b) a second layer, the second layer comprising a high glass transition temperature polyimide layer having a glass transition temperature above the low glass transition temperature polyimide layer, wherein the difference in lamination temperature between the high glass transition temperature layer and the low glass transition temperature layer is in a range between and including 10 and 200° C.; and c) pre-drilled organic core material selected from the group consisting of BT-epoxy-glass core or FR-4 core having a plurality of laser induced microvias of 10-100 µm in diameter in the core material, the microvias comprising a copper interconnect;

wherein at least one surface of the core material is bonded to at least one surface of either the first layer or the second layer, said microvia extending from the core material into or through said first layer or said second layer.

* * * * *

UNITED STATES PATENT AND TRADEMARK OFFICE
CERTIFICATE OF CORRECTION

| | |
|---|---|
| PATENT NO. | : 7,285,321 B2 |
| APPLICATION NO. | : 10/706000 |
| DATED | : October 23, 2007 |
| INVENTOR(S) | : Kuppusamy Kanakarajan, Brian C. Auman and Sounak Banerji |

It is certified that error appears in the above-identified patent and that said Letters Patent is hereby corrected as shown below:

Title Page, Item (75) Inventors:
 Please change "Kuppsuamy Kanakarajan, Dublin, OH (US);" to read -- Kuppusamy Kanakarajan, Dublin, OH (US); --.

Signed and Sealed this

Fourth Day of November, 2008

JON W. DUDAS
*Director of the United States Patent and Trademark Office*